United States Patent
Lou

(10) Patent No.: US 6,413,856 B1
(45) Date of Patent: *Jul. 2, 2002

(54) METHOD OF FABRICATING DUAL DAMASCENE STRUCTURE

(75) Inventor: Chine-Gie Lou, Hsinchu Hsien (TW)

(73) Assignee: Worldwide Semiconductor Manufacturing Corp. (TW)

(*) Notice: Subject to any disclaimer, the term of this patent is extended or adjusted under 35 U.S.C. 154(b) by 0 days.

This patent is subject to a terminal disclaimer.

(21) Appl. No.: 09/414,817

(22) Filed: Oct. 8, 1999

(30) Foreign Application Priority Data

Sep. 3, 1999 (TW) .......................... 88115261 A

(51) Int. Cl.[7] .......................................... H01L 21/4763
(52) U.S. Cl. ........................ 438/638; 438/618; 438/624
(58) Field of Search ................................. 438/652, 638, 438/637, 618, 624

(56) References Cited

U.S. PATENT DOCUMENTS

| 5,635,423 A | * | 6/1997 | Huang et al. | 438/638 |
| 6,087,252 A | * | 7/2000 | Lu | 438/638 |
| 6,140,226 A | * | 10/2000 | Grill et al. | 438/637 |
| 6,165,898 A | * | 12/2000 | Jang et al. | 438/438 |
| 6,187,661 B1 | * | 2/2001 | Lou | 438/638 |

* cited by examiner

Primary Examiner—Michael Trinh

(57) ABSTRACT

A method of forming dual damascene structure is disclosed. A pad oxide layer, a barrier layer and an organic dielectric layer are formed in sequence on a substrate with the conducting line and the organic dielectric layer is etched with a patterned photoresist as a mask to form trenches therein. Next, an anisotropic thickness oxide layer is formed on the substrate by the plasma enhanced chemical vapor deposition (PECVD). Then, the anisotropic thickness oxide layer, the barrier layer and the pad oxide layer are etched with a patterned photoresist as a mask to form vias therein until the conducting line is exposed. Finally, a metal layer is deposited on the substrate and fills the vias and the trenches to form the dual damascene structure.

13 Claims, 2 Drawing Sheets

METHOD OF FABRICATING DUAL DAMASCENE STRUCTURE

FIELD OF THE INVENTION

The present invention relates generally to a method for fabricating dual damascene structure and in particular relates to a process to avoid the organic dielectric layer damaged by the oxygen-containing plasma.

BACKGROUND OF THE INVENTION

As feature size of the semiconductor devices has become smaller and multilevel metallization commonplace in integrated circuits, low dielectric constant films have become increasingly important. Unfortunately, as the metal spacing decreases, the interlevel (on the same metal level) and the intralevel (between metal levels) capacitance increase when the insulator having the same dielectric constant (k) is used, since the capacitance C is inversely proportional to spacing d between the conducting lines ($C=k\epsilon_0 A/d$ where k is the dielectric constant, $\epsilon_0$ indicates the permittivity in a vacuum, A is the area, and d is the thickness of the capacitor dielectric). Additionally, the RC delay time is proportional to the capacitance C (R is the resistance of the conducting lines). That is, the electrical property (frequency response) of the semiconductor devices perform badly. Therefore, it is very desirable to minimize the dielectric constant k of the insulator between the conducting lines to reduce the capacitance C, and therefore the RC delay time, where C indicates the interlevel and/or the intralevel capacitance mentioned above.

Generally, one approach to minimize the capacitance C of the multilevel interconnection is to form an organic SOG (spin on glass). It is one dielectric material with low dielectric constant and has a good capability of gap-filling. However, organic SOG is sensitive to moisture and will become unstable when it exposed to oxygen-containing plasma. After damaged by the oxygen-containing plasma, the moisture absorption ability will increase to several order of degree.

One will have the same problem in the process of fabricating the dual damascene structure. There is one traditional dual damascene process described as follows.

Referring to FIG. 1, a liner oxide layer 123, the first insulative layer 130, etching-stop layer 138 are formed in sequence on the substrate 110 with the conducting lines 125. Then, the etching-stop layer 138 is etched with photoresist as a mask having a via image to form a via pattern 135 therein. Next, the second insulative layer 140 is deposited on the etching-stop layer 138.

Subsequently, a photoresist layer (not shown) is formed on the second insulative layer 140 and the photoresist layer is patterned with lithography processes to form trench 150 image therein. Then, the second insulative layer 140 is etched with the photoresist as a mask and meanwhile the first insulative layer 130 is etched with the etching-stop layer 138 as a mask. The result of this etching step is to form a trench 150 in the second insulative layer 140 and a via 135 in the etching stop layer 138, the first insulative layer 130 and the liner oxide layer 123, as shown in the FIG. 2.

Refer to FIG. 3, a metal layer 160 is deposited on the second insulative layer 140 and fill the via 135 and trench 150. And the substrate 110 is processed with chemical mechanical polishing (CMP) until the upper surface of the second insulative layer 140 is exposed. Then, some further steps will be processed on the planarized substrate surface.

As described above, the first insulative layer 130 and the second insulative layer 140 are formed with spin on glass. They will have the problem of moisture-absorption, in particularly, when the organic SOG with low dielectric constant is used. The organic SOG is very sensitive to the moisture. While it exposed to the oxygen-containing plasma, the damaged organic SOG will induce the water-releasing of the organic SOG. This will cause the increasing of the contact resistance and impact the property of the device.

If organic SOG is used as inter-metal dielectric layer in the traditional dual damascene, the adjustment of the dual damascene process is needed to avoid the aforementioned problem. Therefore, one new dual damascene process and structure is provided in present invention to solve the problem.

SUMMARY OF THE INVENTION

The present invention provides a manufacturing process for making the sidewall of the organic dielectric layer free from damaged by the oxygen-containing plasma.

Another object of the present invention is to provide a process to avoid the organic dielectric layer releasing moisture to the metal layer.

A further object of the present invention is to provide a method to shorten the RC delay time and to lower the contact resistance.

A pad oxide layer is formed on a substrate with conducting lines and then a barrier layer with the thickness range about 200 to 1000 angstroms is formed on the pad oxide layer by PECVD method. Next, an organic dielectric layer with low dielectric constant is formed on the barrier layer by spinning method and the organic dielectric layer is etched with a patterned the photoresist as a mask and the barrier layer as a etching-stop layer to form trench therein. Then, an anisotropic thickness oxide layer is formed on the substrate by PECVD method. Subsequently, a photoresist layer is formed on the anisotropic thickness oxide layer and the photoresist layer is patterned with lithography processes to form via image therein. Then, the anisotropic thickness oxide layer, the barrier layer and the pad oxide layer are etched with the photoresist as a mask until the conducting line is exposed, and the photoresist layer with the pattern of via is removed by an oxygen-containing plasma. The anisotropic thickness oxide layer of the present invention can protect the organic dielectric layer and prevent from the increasing of the contact resistance. Finally, a metal layer is deposited on the substrate and fills the vias and trenches to form the dual damascene structure.

BRIEF DESCRIPTION OF THE DRAWINGS

The objects, features and advantages of the present invention will be apparent from the following more particularly description of the invention illustrated in the accompanying drawings, in which.

DETAILED DESCRIPTION OF THE PREFERRED EMBODIMENT

Figure 1:
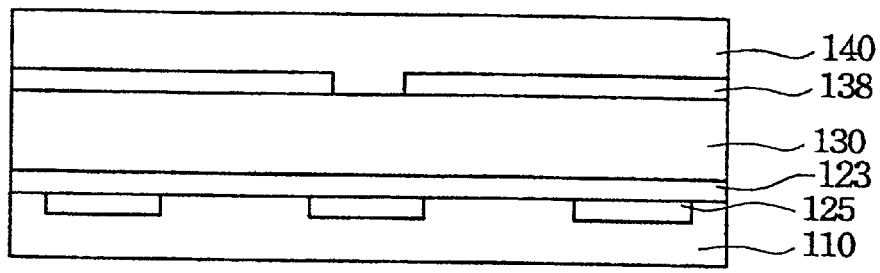
FIG. 1 is a cross sectional view of a semiconductor substrate illustrating the step of forming via in the etching-stop layer according to the prior art.
Figure 2:
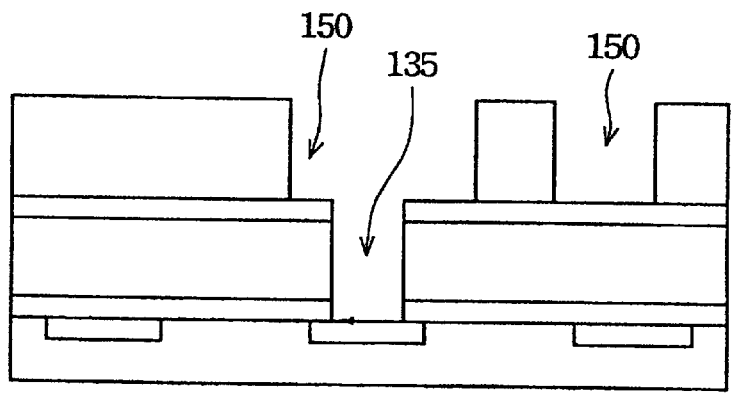
FIG. 2 is a cross sectional view of a semiconductor substrate illustrating the steps of forming vias in the first insulative layer and forming trenches in the second insulative layer according to the prior art.
Figure 3:
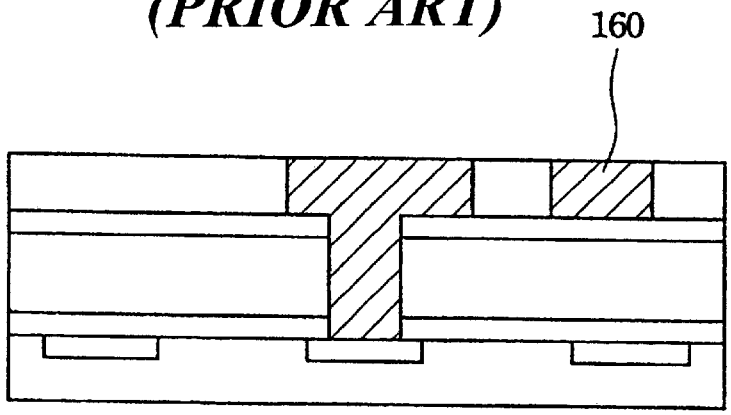
FIG. 3 is a cross sectional view of a semiconductor substrate illustrating the step of forming a metal layer and filling the vias and trenches according to the prior art.

Hereinafter, the preferred embodiments of the invention will be described with reference to accompany drawing wherein like reference numerals designate like parts, respectively.

Figure 4:
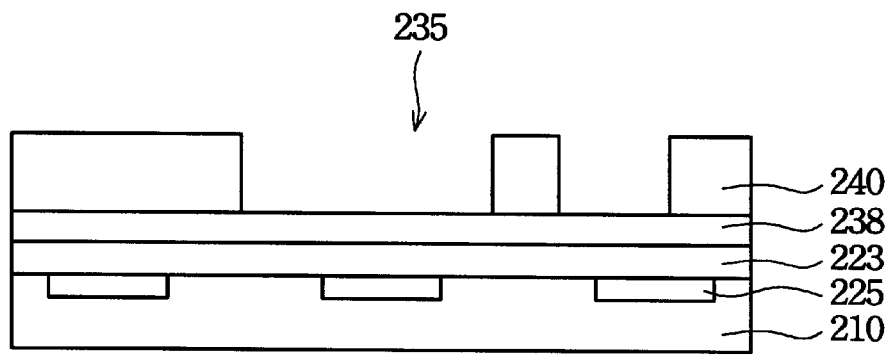
FIG. 4 is a cross sectional view of a semiconductor substrate illustrating the step of forming trenches in accordance with the present invention.

Referring to FIG. 4, a single crystal substrate 210 with a <100> crystallographic orientation is used for preferred embodiment. There has been conducting lines 225 on the substrate 210. First, a pad oxide layer 223 with the thickness range about 300 to 2000 angstroms is formed on the substrate 210 by the plasma enhanced chemical vapor deposition (PECVD). Then, a barrier layer 238 with the thickness range about 200 to 1000 angstroms is formed on the pad oxide layer 223. The barrier layer 238 as an etching stop layer in the etching process of the organic SOG layer to increase the process window. The barrier layer 238 can be a silicon-nitride layer, but will not limit the scope of the present invention.

Next, an organic SOG layer 240 with low dielectric constant is formed on the barrier layer 238 by spinning method. The thickness of the organic SOG layer 240 is in the range about 3000 to 8000 angstroms. Afterwards, a photoresist layer (not shown) is formed on the organic SOG layer 240 and the photoresist layer is patterned with lithography processes, to form trench 235 image therein. Then, the organic SOG layer 240 is etched with the photoresist layer as a mask and the barrier layer 238 as an etching-stop layer to form trench 235 therein. After this etching step, the photoresist layer is removed with the oxygen-containing plasma. Because of the sensitive to oxygen, the sidewall of the organic SOG layer 240 will be damaged.

Figure 5:
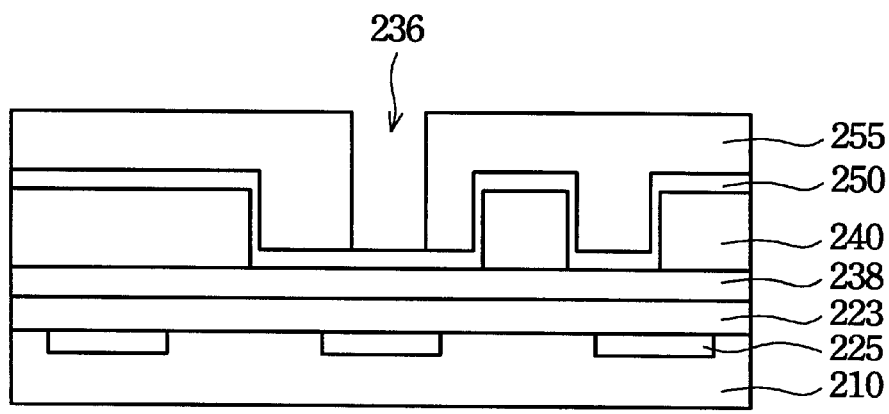
FIG. 5 is a cross sectional view of a semiconductor substrate illustrating the step of forming a photoresist layer with the pattern of the vias in accordance with the present invention.

Referring to FIG. 5, an anisotropic thickness oxide layer 250 is deposited on the substrate 210 by the plasma enhanced chemical vapor deposition (PECVD). By adjusting the ratio of $O_2$TEOS, the lower sidewall step coverage of the anisotropic thickness oxide layer 250 is performed. This can lower the capacitance of the neighboring interconnect. Then, a photoresist layer 255 is formed on the anisotropic thickness oxide layer 250 and the photoresist layer 255 is patterned with lithography processes to form via 236 image therein. Next, the anisotropic thickness oxide layer 250, the barrier layer 238 and the pad oxide layer 223 are etched with the photoresist layer 255 as a mask by etchant with fluorine and oxygen gas until the conducting line 225 is exposed. The ratio of the fluorine and oxygen can be adjusted to etch different material, such as oxide or nitride. Therefore, the via 236 is formed in the anisotropic thickness oxide layer 250, the barrier layer 238 and the pad oxide layer 223. Not like the traditional via in the dielectric layer, the via 236 of the present invention is in the anisotropic thickness oxide layer 250, the barrier layer 238 and the pad oxide layer 223. The advantage of the, present invention is that over-etching is a seldom phenomenon during etching the oxide and nitride layer. So, it is easy to create a good shape of via. Even the process with some alignment problem in the case, the shift of the via will not cause the too smaller contact area of the via and the conducting line.

Subsequently, the photoresist layer 255 with the pattern of the via 236 is removed by the oxygen-containing plasma. If the organic SOG layer 240 is not protected by the anisotropic thickness oxide layer 250 of the present invention, it will be damaged again in the above oxygen-containing plasma step. It will cause increasing ability of moisture-absorption of the organic SOG layer 240 and increasing the contact resistance of the interconnects. Therefore, the anisotropic thickness oxide layer 250 not only can protect the damaged sidewall of the organic SOG layer 240 in the first photoresist removing step, but also avoid the organic SOG layer 240 damaged again in the second photoresist removing step. And the organic SOG layer 240 will not release moisture to increase the contact resistance.

Figure 6:
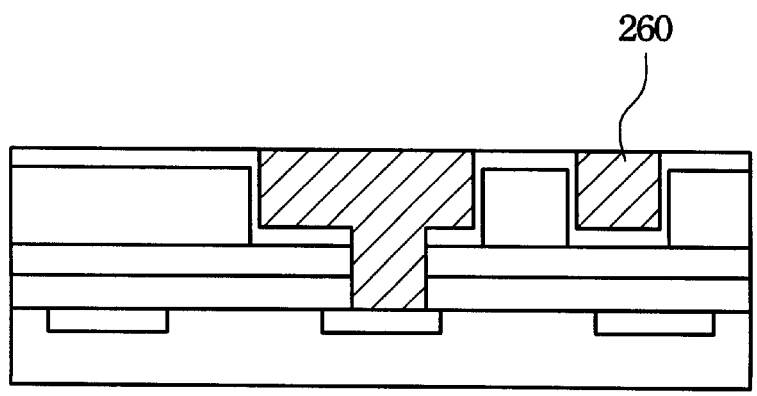
FIG. 6 is a cross sectional view of a semiconductor substrate illustrating the step of forming a metal layer and filling the vias and trenches in accordance with the present invention.

Refer to FIG. 6, a metal layer 260 is deposited on the substrate 210 and fill the via 236 and the trench 235 to form the dual damascene structure. Finally, the substrate 210 is processed with chemical mechanical polishing (CMP) and some further steps will be processed on the planarized substrate surface.

According to the above description, there are several advantages of the present invention: (1) the anisotropic thickness oxide layer formed on the organic SOG layer can avoid the sidewall of the organic SOG layer damaged by the oxygen-containing plasma during removing the photoresist layer (2) prevent from the contact resistance increasing (3) the barrier layer below the organic SOG layer can increase the process window and increase the yield of the product (4) to form the via in the oxide and nitride layer can avoid the over-etching problem and avoid the shift of the via when the alignment problem appears in the process (5) the anisotropic thickness oxide layer can lower the capacitance of the neighboring interconnect.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

The embodiments of the invention in which an exclusive property or privilege is claimed are defined as follows:

1. A method of forming a dual damascene, said method comprising the steps of:

providing a substrate with conducting lines, said conducting lines being on a surface of said substrate;

depositing a pad oxide layer on said substrate;

depositing a barrier layer on said pad oxide layer;

forming an organic dielectric layer on said barrier layer;

processing a first lithography and etching step to etch said organic dielectric layer until said barrier layer is exposed, and forming trenches in said organic dielectric layer;

depositing an anisotropic thickness oxide layer on said exposed barrier layer, sidewalls of said trenches and said organic dielectric layer by a plasma enhanced chemical vapor deposition, said anisotropic thickness oxide layer protecting the damaged sidewall of said organic dielectric layer after photoresist removing during said first lithography and etching step; and processing a second lithography and etching step to etch said anisotropic thickness oxide layer, said barrier layer and said pad oxide layer until a surface of said conducting lines is exposed, and forming vias in said anisotropic thickness oxide layer, said barrier layer and said pad oxide layer.

2. The method of claim 1, wherein said barrier layer is formed with a thickness of about 200–1000 angstroms.

3. The method of claim 1, wherein said anisotropic thickness oxide layer is deposited by adjusting a ratio of $O_2$/TEOS to lower step coverage of said anisotropic thickness oxide layer.

4. The method of claim 1, wherein said anisotropic thickness oxide layer prevents said organic dielectric layer from being damaged in a photoresist removal after said second lithography and etching step.

5. The method of claim 1, wherein said photoresist removing is performed by an oxygen-containing plasma.

6. The method of claim 1, further comprising a step of depositing a metal layer to form said dual damascene after said second lithography and etching step.

7. A method of forming a dual damascene, said method comprising the steps of:

providing a substrate with conducting lines, said conducting lines being on a surface of said substrate;

depositing a pad oxide layer on said substrate;

depositing a barrier layer on said pad oxide layer;

forming an organic dielectric layer on said barrier layer, said organic dielectric layer is spin on glass;

processing a first lithography and etching step to etch said organic dielectric layer until said barrier layer is exposed, and forming trenches in said organic dielectric layer;

depositing an anisotropic thickness oxide layer on said exposed barrier layer, sidewalls of said trenches and said organic dielectric layer by a plasma enhanced chemical vapor deposition, said anisotropic thickness oxide layer protecting the damaged sidewall of said organic dielectric layer after photoresist removing during said first lithography and etching step; and processing a second lithography and etching step to etch said anisotropic thickness oxide layer, said barrier layer and said pad oxide layer until a surface of said conducting lines is exposed, and forming vias in said anisotropic thickness oxide layer, said barrier layer and said pad oxide layer.

8. The method of claim 7, wherein said barrier layer is in a thickness range of about 200–1000 angstroms.

9. The method of claim 7, wherein said anisotropic thickness oxide layer is deposited by adjusting a ratio of $O_2$/TEOS to lower step coverage of said anisotropic thickness oxide layer.

10. The method of claim 7, wherein said anisotropic thickness oxide layer prevents said organic dielectric layer from being damaged in a photoresist removal after said second lithography and etching step.

11. The method of claim 10, wherein said photoresist removing is performed by an oxygen-containing plasma.

12. The method of claim 7, wherein said photoresist removing is performed by an oxygen-containing plasma.

13. The method of claim 7, further comprising a step of depositing a metal layer to form said dual damascene after said second lithography and etching step.

* * * * *